United States Patent
Kozasa et al.

(10) Patent No.: US 9,991,110 B2
(45) Date of Patent: Jun. 5, 2018

(54) METHOD FOR MANUFACTURING SEMICONDUCTOR WAFER

(71) Applicant: SUMCO CORPORATION, Tokyo (JP)

(72) Inventors: Kazuaki Kozasa, Tokyo (JP); Syunya Kobuchi, Tokyo (JP); Katsuhisa Sugimori, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days. days.

(21) Appl. No.: 15/119,260

(22) PCT Filed: Nov. 19, 2014

(86) PCT No.: PCT/JP2014/080634
§ 371 (c)(1),
(2) Date: Aug. 16, 2016

(87) PCT Pub. No.: WO2015/122072
PCT Pub. Date: Aug. 20, 2015

(65) Prior Publication Data
US 2017/0011903 A1    Jan. 12, 2017

(30) Foreign Application Priority Data
Feb. 17, 2014   (JP) .................................. 2014-027473

(51) Int. Cl.
*H01L 21/02*    (2006.01)
*B24B 37/02*    (2012.01)
(Continued)

(52) U.S. Cl.
CPC .......... *H01L 21/02024* (2013.01); *B24B 9/00* (2013.01); *B24B 9/065* (2013.01);
(Continued)

(58) Field of Classification Search
None
See application file for complete search history.

(56) References Cited

U.S. PATENT DOCUMENTS 5,094,037 A * 3/1992 Hakomori ............... B24B 29/04
451/11
6,482,749 B1  11/2002 Billington et al.
(Continued)

FOREIGN PATENT DOCUMENTS

DE  102013212850   9/2013
JP  2006-186174    7/2006
(Continued)

OTHER PUBLICATIONS

International Search Report issued in Appl. No. PCT/JP2014/080634, dated Jan. 6, 2015.
(Continued)

*Primary Examiner* — Shamim Ahmed
(74) *Attorney, Agent, or Firm* — Greenblum & Bernstein, P.L.C.

(57) ABSTRACT

A mirror-finishing chamfer polishing is applied using an abrasive-grain-free polishing solution to a chamfered portion of a semiconductor wafer having an oxide film on a top side or the top and bottom sides of the semiconductor wafer and having no oxide film on the chamfered portion. Further, prior to the mirror-finishing chamfer polishing, a pre-finish mirror chamfer polishing is applied using an abrasive-grain-containing polishing solution to the chamfered portion of the semiconductor wafer having the oxide film on the top side or the top and bottom sides and on the chamfered portion.

4 Claims, 5 Drawing Sheets

(51) Int. Cl.
 *B24B 9/06* (2006.01)
 *B24B 29/00* (2006.01)
 *B24B 37/24* (2012.01)
 *B24B 9/00* (2006.01)
 *H01L 21/304* (2006.01)
 *B24B 29/02* (2006.01)

(52) U.S. Cl.
 CPC .............. *B24B 29/00* (2013.01); *B24B 29/02* (2013.01); *B24B 37/02* (2013.01); *B24B 37/24* (2013.01); *H01L 21/02021* (2013.01); *H01L 21/304* (2013.01)

(56) References Cited

U.S. PATENT DOCUMENTS

| | | | | |
|---|---|---|---|---|
| 6,685,539 | B1* | 2/2004 | Enomoto | B24B 7/228 257/E21.237 |
| 2005/0142882 | A1* | 6/2005 | Kida | B24B 9/065 438/692 |
| 2008/0026185 | A1 | 1/2008 | Mizushima | |
| 2008/0224270 | A1* | 9/2008 | Ikubo | H01L 21/0206 257/618 |
| 2008/0241603 | A1* | 10/2008 | Isono | G11B 5/7315 428/846.9 |
| 2009/0297755 | A1* | 12/2009 | Koyata | C30B 29/06 428/64.1 |
| 2009/0304976 | A1* | 12/2009 | Matsumoto | C03C 19/00 428/64.2 |
| 2009/0324896 | A1* | 12/2009 | Kato | B24B 9/065 428/192 |
| 2010/0096728 | A1* | 4/2010 | Watanabe | B24B 9/065 257/618 |
| 2010/0178851 | A1 | 7/2010 | Nakanishi et al. | |
| 2011/0256815 | A1 | 10/2011 | Mizushima | |
| 2012/0156878 | A1* | 6/2012 | Ogata | H01L 21/02024 438/692 |
| 2013/0264690 | A1* | 10/2013 | Masuda | C30B 25/186 257/622 |
| 2013/0316521 | A1* | 11/2013 | Sasaki | B24B 37/08 438/478 |

FOREIGN PATENT DOCUMENTS

| | | | |
|---|---|---|---|
| JP | 2006-237055 | | 9/2006 |
| JP | 2008-263027 | | 10/2008 |
| JP | 2009-238818 | | 10/2009 |
| JP | 2010-162624 | | 7/2010 |
| JP | 2010-162624 A | * | 7/2010 |
| JP | 2013-258227 | | 12/2013 |
| JP | 2013-258227 A | * | 12/2013 |
| TW | 201305292 | | 2/2013 |
| TW | 201351497 | | 12/2013 |
| WO | 02/05337 | | 1/2002 |
| WO | 2012/141145 | | 10/2012 |

OTHER PUBLICATIONS

Taiwanese Office Action issued in Appl. No. TW 103145417, dated Jul. 21, 2016 with English language translation.
Taiwanese Office Action issued in Appl. No. TW 103145417, dated Mar. 28, 2016 with English language translation.
Office Action issued in Japan Counterpart Patent Appl. No. 2014-027473, dated Jul. 25, 2017, along with an English translation thereof.

* cited by examiner

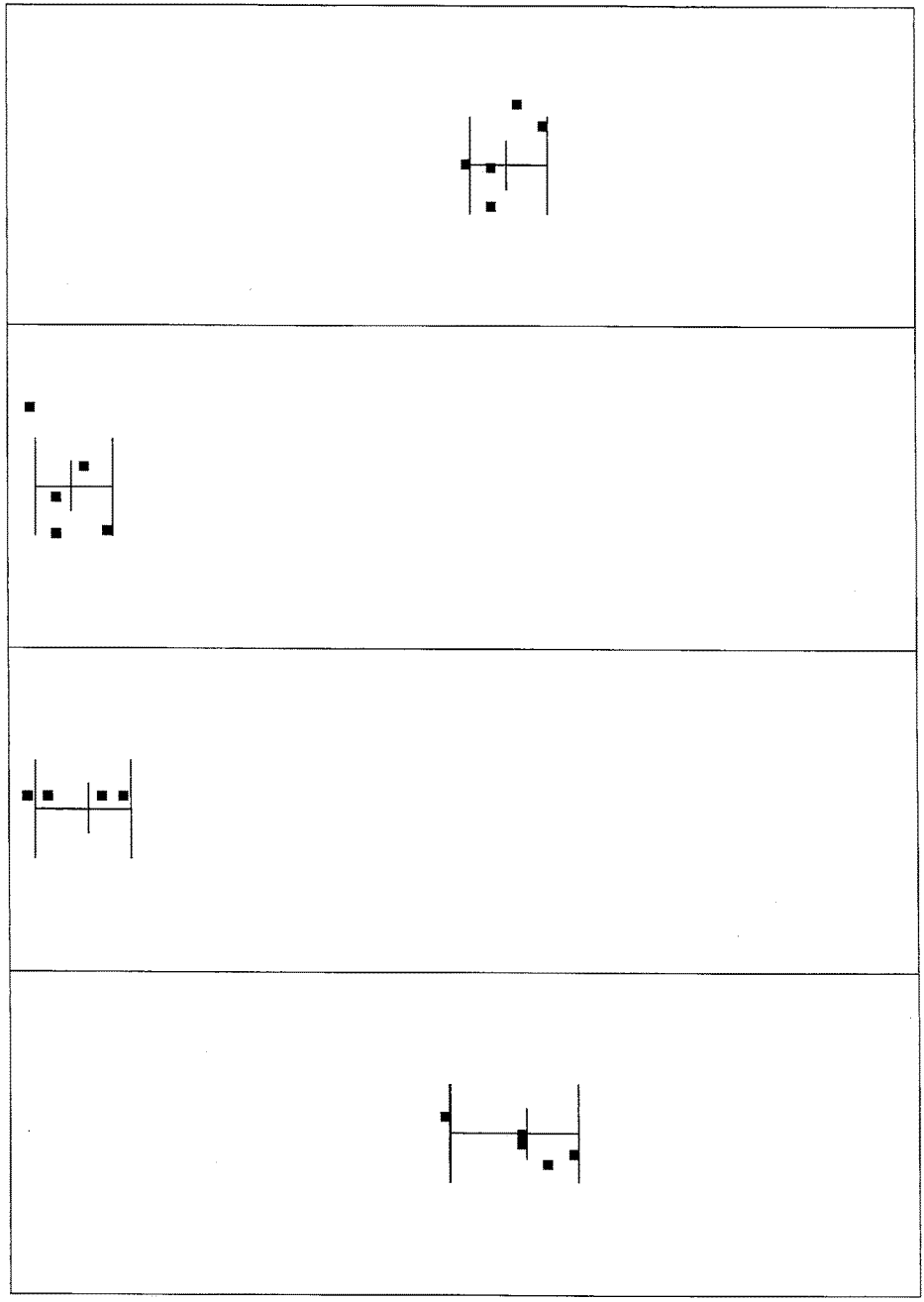

METHOD FOR MANUFACTURING SEMICONDUCTOR WAFER

TECHNICAL FIELD

The present invention relates to a manufacturing method of a semiconductor wafer.

BACKGROUND ART

Typically, top and bottom sides of a semiconductor wafer are subjected to a plurality of stages of mirror-polishing. Specifically, the mirror-polishing is roughly divided into a rough polishing for enhancing the flatness of the semiconductor wafer, and a finish polishing for reducing the surface roughness of the semiconductor wafer.

Further, the mirror-polishing is not only applied to the top and bottom sides of the semiconductor wafer, but also to a chamfered portion of the semiconductor wafer in order to prevent a generation of dust from the chamfered portion.

The rough polishing is performed through a simultaneous double-sided polishing in which top and bottom sides of a semiconductor wafer received in a carrier are simultaneously polished. During the simultaneous double-sided polishing, the semiconductor wafer touches an inner circumferential surface of the carrier to cause scars and impressions on the chamfered portion. Accordingly, the mirror-polishing is applied to the chamfered portion after the rough polishing in order to remove the generated scars and impressions.

Typically, the chamfered portion is mirror-polished in two stages including: a first step for polishing the chamfered portion using an unwoven fabric polishing pad and abrasive-grain-containing polishing solution; and a second step for finishing the polishing using a suede polishing pad and abrasive-grain-containing polishing solution. The first step is performed in order to highly efficiently remove the scars and impressions caused on the chamfered portion. The second step is performed in order to flatten minute surface roughness of the chamfered portion.

However, since a soft polishing cloth is used as the polishing pad for mirror-polishing the chamfered portion, the soft polishing cloth is not only applied on the chamfered portion but also applied over the top and/or bottom side of the wafer during the progress of the polishing (sometimes referred to as an "over-polishing" hereinafter).

Specifically, an oxide film 101A present on a chamfered portion 101 of a semiconductor wafer 100 is removed in the first step as shown in FIG. 5A. However, as shown in FIG. 5B, not only the oxide film 101A present on the chamfered portion 101 but also an oxide film 102B present at a part of the oxide film 102A on a wafer surface 102, to which a polishing cloth (unwoven fabric) 111 of the polishing pad is applied, is removed. Further, a stress is locally concentrated to a border portion 103 between the wafer surface 102 and the chamfered portion 101 which emerges by removing the oxide film 102B, so that the polishing progresses around the border portion 103.

Next, subsequent to the first step, the oxide film 102B present at a part of the wafer surface 102, to which a polishing cloth (suede) 112 of the polishing pad is applied, is removed in the second step as shown in FIG. 5C. Then, a stress is locally applied to the border portion 103 between the exposed wafer surface 102 and the chamfered portion 101, so that the polishing further progresses around the border portion 103.

The above-described over-polishing reduces the thickness of the outer peripheral portion of the semiconductor wafer (sometimes referred to as an edge roll-off).

It has been disclosed that, in order to prevent the edge roll-off caused by the over-polishing, the polishing pad is formed by adhering at least two layers including a polishing cloth layer and a sponge layer whose hardness is lower than that of the polishing cloth layer, and the hardness of the polishing cloth layer is set at 40 or less in ASKER C hardness (see, for instance, Patent Literature 1). In Patent Literature 1, the width of the over-polishing can be reduced to 400 μm or less with the use of the above-structured polishing pad.

Another manufacturing method of a semiconductor wafer has been disclosed, in which a resin protection film is formed on top and bottom sides of a semiconductor wafer after a double-sided polishing, a mirror-finish chamfering step is performed, and subsequently the resin protection film is removed (see, for instance, Patent Literature 2). In Patent Literature 2, the resin protection film formed on the top and bottom sides of the semiconductor wafer restrains the over-polishing during the mirror-finish chamfering step to prevent the edge roll-off.

CITATION LIST

Patent Literature(s)

Patent Literature 1 WO 2002/005337 A
Patent Literature 2 JP-A-2006-237055

SUMMARY OF THE INVENTION

Problem(s) to be Solved by the Invention

However, since the hardness of the polishing cloth layer in contact with the wafer is increased to restrain the wafer from sinking into the polishing pad in Patent Literature 1, though the over-polishing can be restrained, microroughness on the chamfered portion is deteriorated.

The method disclosed in Patent Literature 2 requires washing processes each for forming the resin protection film and for removing the resin protection film, so that the production cost increases.

Further, when the resin for forming the protection film extends not only to both of the top and bottom sides but also to the chamfered portion, the chamfered portion is partially or entirely restrained from being polished during the mirror-polishing step. Accordingly, it is necessary to accurately form the protection film only on the top and bottom sides of the wafer so as to keep the resin from being applied to the chamfered portion, which, however, is technically difficult.

Further, when the wafer is washed for removing the resin protection film, the resin once removed is sometimes adhered again and the resin protection film may not be completely removed.

An object of the invention is to provide a manufacturing method of a semiconductor wafer capable of enhancing a flatness on the outer peripheral portion of the semiconductor wafer and simultaneously capable of flattening the roughness on a chamfered portion of the semiconductor wafer during the mirror chamfer polishing.

Means for Solving the Problem(s)

A manufacturing method of a semiconductor wafer according to an aspect of the invention is for a semiconductor wafer including a top side, a bottom side, a chamfered portion and an oxide film, the oxide film being provided on the top side or on the top and bottom sides and not provided on the chamfered portion, the method including: applying a mirror-finishing chamfer polishing to the chamfered portion using a abrasive-grain-free polishing solution.

According to the above aspect of the invention, the mirror-finishing chamfer polishing is applied using the abrasive-grain-free polishing solution to the semiconductor wafer having the oxide film on the top side or the top and bottom sides and having no oxide film on the chamfered portion. Since the oxide film is not removed by the polishing using the abrasive-grain-free polishing solution, the area in which the oxide film is present (i.e. the top side or the top and bottom sides of the wafer) is not polished but the polishing progresses only on the chamfered portion at which no oxide film is present. Accordingly, even when the wafer is polished while the polishing pad is applied not only on the chamfered portion but also on the top side or the top and bottom sides, the oxide film present on the top side or the top and bottom sides serves as a stopper to prevent the occurrence of the over-polishing. Consequently, the flatness of the outer peripheral portion of the semiconductor wafer can be enhanced, while flattening the roughness on the chamfered portion.

In the manufacturing method of a semiconductor wafer according to the above aspect of the invention, it is preferable that the method includes, prior to the mirror-finishing chamfer polishing, applying a pre-finish mirror chamfer polishing to the chamfered portion of the semiconductor wafer comprising the oxide film on the top side or on the top and bottom sides and on the chamfered portion using an abrasive-grain-containing polishing solution.

According to the above arrangement, prior to the mirror-finishing chamfer polishing, the pre-finish mirror chamfer polishing using the abrasive-grain-containing polishing solution is performed. The oxide film can be removed through the polishing using the abrasive-grain-containing polishing solution. Accordingly, by applying the pre-finish mirror chamfer polishing to the chamfered portion of the semiconductor wafer having the oxide film not only on the top side or the top and bottom sides but also on the chamfered portion, the oxide film on the chamfered portion is removed. Consequently, the semiconductor wafer having the oxide film on the top side or the top and bottom sides and having no oxide film on the chamfered portion can be produced by applying the pre-finish mirror chamfer polishing. Further, the scars and impressions generated on the chamfered portion can be more efficiently removed by the polishing using the abrasive-grain-containing polishing solution than the polishing using the abrasive-grain-free polishing solution. Accordingly, the efficiency of the subsequent process (i.e. the mirror-finish chamfer polishing) can be enhanced by applying the pre-finish mirror chamfer polishing.

In the manufacturing method of a semiconductor wafer according to the above aspect of the invention, it is preferable that an unwoven fabric of less than 7% of a compression rate is used for a polishing pad used in the pre-finish mirror chamfer polishing, and suede of 6% or more of the compression rate is used for the polishing pad used in the mirror-finishing chamfer polishing.

An unwoven fabric of less than 7% of the compression rate is used for the polishing pad used in the pre-finish mirror chamfer polishing, and suede of 6% or more of the compression rate is used for the polishing pad used in the mirror-finishing chamfer polishing. Since the compression rates of the polishing pads used in the above steps are defined as a specific combination, the over-polishing can be more reliably restrained in the pre-finish mirror chamfer polishing and the roughness of the chamfered portion can be more reduced in the mirror-finishing chamfer polishing.

In the manufacturing method of a semiconductor wafer according to the above aspect of the invention, it is preferable that the abrasive-grain-free polishing solution used in the mirror chamfer polishing comprises a polymer.

According to the above arrangement, the abrasive-grain-free polishing solution used in the mirror chamfer polishing is added with a polymer. Since the polymer is added to the abrasive-grain-free polishing solution, the wettability of the semiconductor wafer during the mirror-finishing chamfer polishing can be enhanced.

BRIEF DESCRIPTION OF DRAWING(S)

FIG. 4 shows microroughness of a chamfered portion of the semiconductor wafer in Examples and Comparative Examples.

DESCRIPTION OF EMBODIMENT(S)

Exemplary embodiment(s) of the invention will be described below with reference to the attached drawings.

In the manufacturing method of a semiconductor wafer of the exemplary embodiment, a monocrystal ingot pulled up using Czochralski method and the like is initially sliced with a multi-wire saw and the like. Subsequently, in order to prevent breakage and crack of the sliced wafer, peripheral edges of the wafer are chamfered.

Next, in order to make the chamfered wafer surface flat, the wafer is subjected to lapping and surface grinding. Then, in order to remove a work affected layer generated on the wafer and generated during the chamfering and lapping, the wafer is subjected to a chemical surface layer removal process through etching.

Next, the etched top and bottom sides of the wafer are subjected to a rough polishing.

The rough polishing is applied in order to polish the wafer to a desired thickness. Specifically, a double-sided polishing machine and a polishing cloth of a hard material (e.g. solidified urethane resin) are used to polish the wafer at a relatively high polishing speed in order to reduce the deviations in the wafer thickness (i.e. to make the wafer flat) after being polished.

Next, the wafer is washed in order to remove residual matters (e.g. abrasive grains and polishing solution used in the rough polishing).

It is favorable to use a washing solution (SC-1) containing ammonia water and hydrogen peroxide water during the washing process. It is especially favorable to wash the wafer through a wet bench washing using an SC-1 solution heated to 50 to 80 degrees C., the solution being prepared by mixing ammonia water and hydrogen peroxide water at a ratio of 1:1 and diluting the mixture with pure water to 5 to 30 times.

After being washed using the SC-1 solution, the wafer is rinsed with pure water. A natural oxide film whose thickness is in a range of approximately 1 nm to 1.1 nm (approximately 10 angstrom to 11 angstrom) is inevitably formed on the entire surface of the washed wafer.

Pre-Finish Mirror Chamfer Polishing

Figure 1A:
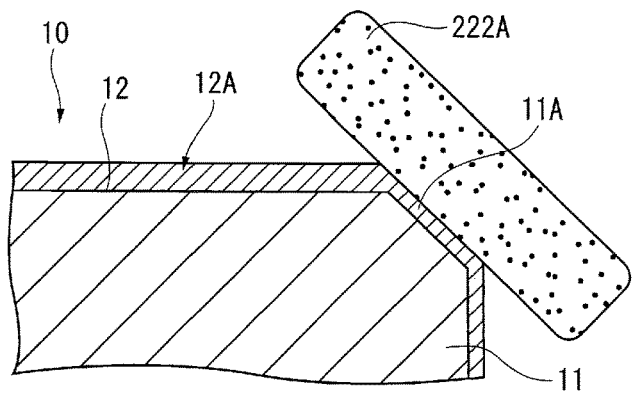
FIG. 1A is an enlarged cross section of a part of a semiconductor wafer during a pre-finish mirror chamfer polishing and a mirror-finishing chamfer polishing according to an exemplary embodiment, which shows how the semiconductor is polished before an oxide film is removed in the pre-finish mirror chamfer polishing.

Next, as shown in FIG. 1A, the pre-finish mirror chamfer polishing is applied to the chamfered portion 11 of the semiconductor wafer 10 (sometimes simply referred to as "wafer" hereinafter) having an oxide film 12A formed on a wafer top side 12 and an oxide film 11A formed on the chamfered portion 11.

Arrangement of Chamfer-Polishing Machine

Figure 2A:
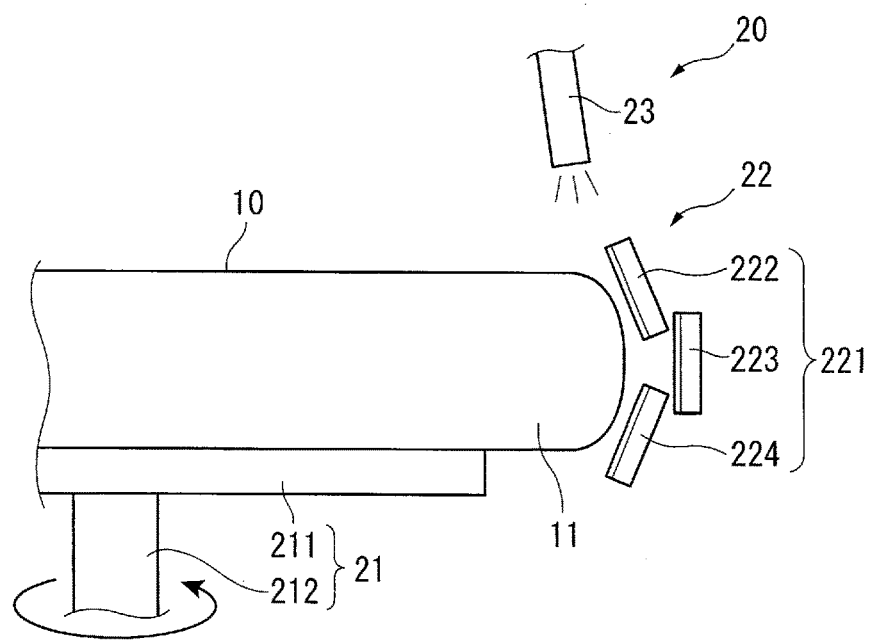
FIG. 2A is a partial enlarged view schematically showing a chamfer-polishing machine according to the exemplary embodiment.
Figure 2B:
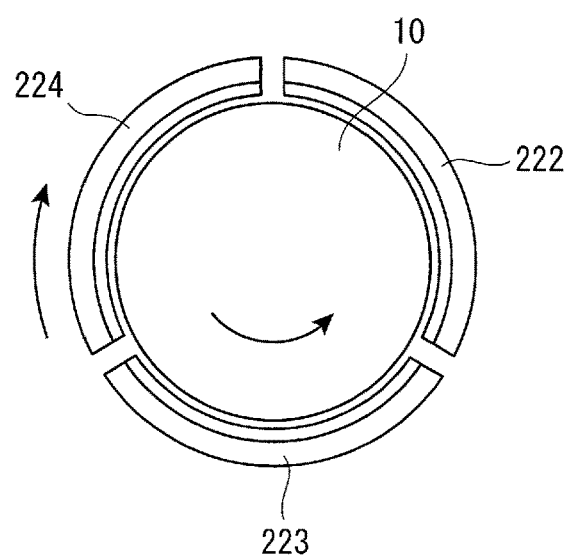
FIG. 2B is a plan view schematically showing the chamfer-polishing machine according to the exemplary embodiment.

A chamfer-polishing machine used in the pre-finish mirror chamfer polishing of the exemplary embodiment will be described below. FIG. 2A is a partial enlarged schematic illustration of the chamfer-polishing machine. FIG. 2B is a plan view of the chamfer-polishing machine.

As shown in FIG. 2A, the chamfer-polishing machine 20 includes a wafer suction unit 21 configured to suck a lower side of the wafer 10, a polishing unit 22 configured to mirror-polish the wafer 10 sucked by the wafer suction unit 21, and a pipe 23 disposed above the polishing unit 22 and configured to supply the polishing solution.

The wafer suction unit 21 includes a suction stage 211 (holder) configured to hold the lower side of the wafer 10 by suction, and a rotor 212 configured to rotate the suction stage 211.

The polishing unit 22 includes a polishing wheel 221 configured to mirror-polish the chamfered portion 11 of the wafer 10 and a drive unit (not shown) configured to rotate the polishing wheel 221, vertically move the polishing wheel 221 and press the polishing wheel 221 against the wafer 10. The polishing wheel 221 includes an upper-slant polishing pad 222, a vertical-surface polishing pad 223 and a lower-slant polishing pad 224.

It should be noted that the polishing pads 222, 223, 224 are shown to be on the right side in FIG. 2A for the convenience of explanation of a positional relationship with respect to the chamfered portion 11 of the wafer 10. The polishing pads 222, 223, 224 are each actually formed in an arc of the same length and are spaced apart at predetermined intervals around the wafer 10 as shown in FIG. 2B.

Each of the polishing pads 222, 223, 224 are attached with a polishing cloth. Different polishing cloths are preferably used in the pre-finish mirror chamfer polishing and a later-described mirror chamfer polishing as the polishing cloth attached to each of the polishing pads of the chamfer-polishing machine 20. The polishing pad used in the pre-finish mirror chamfer polishing is preferably as hard as possible. Specifically, the polishing cloth used for the polishing pad in the pre-finish mirror chamfer polishing is preferably an unwoven fabric whose compression rate is less than 7%. Especially preferable examples of the unwoven fabric include SUBA800 and SUBA600 manufactured by Nitta Haas Incorporated.

The polishing solution used in the pre-finish mirror chamfer polishing is preferably an alkaline aqueous solution containing abrasive grains. The abrasive grains in the polishing solution are especially preferably colloidal silica whose average particle diameter is 50 nm. The alkaline aqueous solution is especially preferably KOH aqueous solution of pH 10 to 11.

Effect of Pre-Finish Mirror Chamfer Polishing Using Chamfer-Polishing Machine

Next, the effects of the pre-finish mirror chamfer polishing using the above-described chamfer-polishing machine 20 will be described below.

Initially, the lower side of the wafer 10 is sucked by the wafer suction unit 21 to hold the wafer 10. Then, each of the polishing pads 222, 223, 224 of the polishing wheel 221 is pressed against and is kept pressed by a predetermined pressure at the corresponding part of the chamfered portion.

Next, while supplying the polishing solution from the pipe 23 to each of the polishing pads, the rotor 212 is rotated to rotate the wafer 10 and, simultaneously, the polishing wheel 221 is rotated by the drive unit to rotate each of the polishing pads 222, 223, 224 as shown in FIG. 2B.

According to the above arrangement, the upper part of the chamfered portion 11 of the wafer 10 is polished by the upper-slant polishing pad 222, the central part of the chamfered portion 11 is polished by the vertical-surface polishing pad 223 and the lower part of the chamfered portion 11 is polished by the lower-slant polishing pad 224.

Figure 1B:
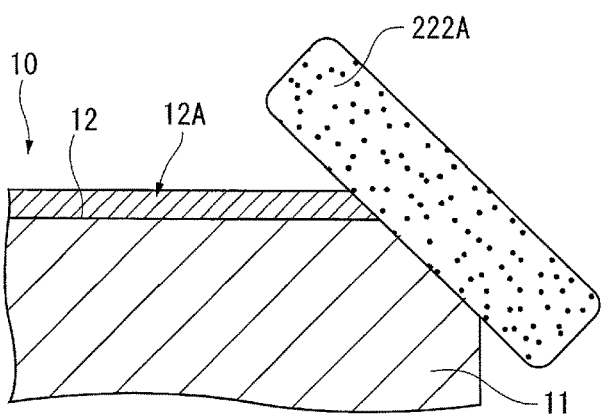
FIG. 1B is another enlarged cross section of the part of the semiconductor wafer during the pre-finish mirror chamfer polishing and the mirror-finishing chamfer polishing according to the exemplary embodiment, which shows how the semiconductor is polished after the oxide film is removed in the pre-finish mirror chamfer polishing.

As shown in FIGS. 1A and 1B, since the polishing pad uses a polishing cloth (unwoven fabric) 222A with a high hardness in the pre-finish mirror chamfer polishing, the wafer 10 is kept from being sunk into the polishing pad during the polishing. Accordingly, the polishing cloth (unwoven fabric) 222A of the polishing pad is restrained from being applied onto the wafer top side 12 beyond the chamfered portion 11. As a result, the over-polishing is kept from being caused during the pre-finish mirror chamfer polishing but only the oxide film 11A present on the chamfered portion 11 is removed. Thus, the wafer 10 having the oxide film 12A on the top and bottom sides thereof and having no oxide film on the chamfered portion 11 is produced. Further, the pre-finish mirror chamfer polishing removes the scars and impressions caused during the rough polishing.

Mirror-Finishing Chamfer Polishing

Subsequently to the pre-finish mirror chamfer polishing, the mirror-finishing chamfer polishing is applied to the chamfered portion 11 of the wafer 10 having the oxide film on the top and bottom sides thereof and having no oxide film on the chamfered portion 11.

Arrangement of Chamfer-Polishing Machine

The chamfer-polishing machine 20 having the same arrangement as the chamfer-polishing machine used in the above-described pre-finish mirror chamfer polishing is usable in the mirror-finishing chamfer polishing of the exemplary embodiment.

The polishing pad used in the mirror-finishing chamfer polishing preferably has a hardness as low as possible. Specifically, the polishing cloth used for the polishing pad in the mirror-finishing chamfer polishing is preferably suede whose compression rate is 6% or more. Especially preferable example of the suede is SUPREME-RN manufactured by Nitta Haas Incorporated.

The polishing solution used in the mirror-finishing chamfer polishing is preferably an alkaline aqueous solution containing no abrasive grains. The alkaline aqueous solution is especially preferably KOH aqueous solution of pH 10 to 11. The abrasive-grain-free polishing solution used in the mirror chamfer polishing preferably contains polymer.

Effect of Mirror Chamfer Polishing Using Chamfer-Polishing Machine

Next, the effects of the mirror chamfer polishing using the above-described chamfer-polishing machine 20 will be described below. The chamfer-polishing machine 20 is driven in the same manner as in the above-described pre-finish mirror chamfer polishing and will not be described.

Figure 1C:
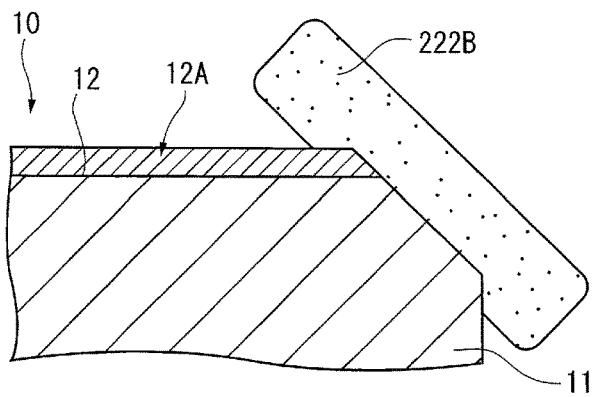
FIG. 1C is still another enlarged cross section of the part of the semiconductor wafer during the pre-finish mirror chamfer polishing and the mirror-finishing chamfer polishing according to the exemplary embodiment, which shows how the semiconductor is polished in the mirror-finishing chamfer polishing.

Since the abrasive-grain-free polishing solution is used, the polishing only on the chamfered portion 11 at which no oxide film is present progresses in the mirror-finishing chamfer polishing as shown in FIG. 1C. In other words, even when the polishing cloth (suede) 222B of the polishing pad is applied on the wafer top side 12 or a backside of the wafer while polishing, since the oxide film cannot be polished with the use of the abrasive-grain-free polishing solution, the over-polishing does not occur but the roughness of only the chamfered portion 11 is flattened.

After finishing the mirror-finishing chamfer polishing, the oxide film 12A present on the wafer top side 12 is removed using a single-side polishing machine to mirror-finish the top side or top and bottom sides of the wafer 10.

Advantage(s) of Embodiment(s)

As described above, the following advantages are achievable by the above-described exemplary embodiment.

(1) The mirror-finishing chamfer polishing is applied using the abrasive-grain-free polishing solution to the chamfered portion 11 of the wafer 10 having the oxide film 12A on the wafer top side 12 or the top and bottom sides and having no oxide film on the chamfered portion 11.

According to the above arrangement, since the oxide film is not removed by the polishing using the abrasive-grain-free polishing solution, the polishing does not progress on the area in which the oxide film is present (i.e. the wafer top side 12 or the top and bottom sides of the wafer) but the polishing progresses only on the chamfered portion 11 at which no oxide film is present. Accordingly, even when the wafer is polished while the polishing cloth (suede) 222B of the polishing pad is applied not only on the chamfered portion 11 but also on the wafer top side 12 or the top and bottom sides, the oxide film 12A present on the wafer top side 12 or the top and bottom sides serves as a stopper to prevent the occurrence of the over-polishing. Consequently, the flatness of the outer peripheral portion of the wafer 10 can be enhanced, while flattening the roughness of the chamfered portion 11.

(2) The pre-finish mirror chamfer polishing is applied using the abrasive-grain-containing polishing solution to the chamfered portion 11 of the wafer 10 having the oxide film 11A, 12A on the wafer top side 12 or the top and bottom sides and the chamfered portion 11 prior to the mirror-finishing chamfer polishing.

According to the above arrangement, the oxide film can be removed through the polishing using the abrasive-grain-containing polishing solution. Consequently, by applying the pre-finish mirror chamfer polishing to the chamfered portion 11 of the wafer 10 at which the oxide film 11A, 12A is present not only on the wafer top side 12 or the top and bottom sides but also on the chamfered portion 11, the oxide film 11A present on the chamfered portion 11 is removed. Consequently, the wafer 10 having the oxide film 12A on the wafer top side 12 or the top and bottom sides and having no oxide film on the chamfered portion 11 is produced by applying the pre-finish mirror chamfer polishing. Further, the scars and impressions generated on the chamfered portion 11 can be more efficiently removed by the polishing using the abrasive-grain-containing polishing solution than the polishing using the abrasive-grain-free polishing solution. Accordingly, the efficiency of the subsequent process (i.e. the mirror-finish chamfer polishing) can be enhanced by applying the pre-finish mirror chamfer polishing.

(3) An unwoven fabric of less than 7% of the compression rate is used for the polishing pad used in the pre-finish mirror chamfer polishing, and suede of 6% or more of the compression rate is used for the polishing pad used in the mirror-finishing chamfer polishing.

According to the above arrangement, since the compression rates and the like of the polishing pads used in the above steps are defined as a specific combination, the over-polishing can be more reliably restrained in the pre-finish mirror chamfer polishing and the roughness of the chamfered portion can be more reduced in the mirror-finishing chamfer polishing.

(4) The abrasive-grain-free polishing solution used in the mirror chamfer polishing is added with a polymer.

According to the above arrangement, since the polymer is added to the abrasive-grain-free polishing solution, the wettability of the semiconductor wafer during the mirror-finishing chamfer polishing can be enhanced.

Modification(s)

It should be understood that the scope of the invention is not limited to the above exemplary embodiment but includes various improvements and modifications in design as long as such improvements and modifications are compatible with an object of the invention.

Though a polymer is added to the abrasive-grain-free polishing solution used in the mirror-finishing chamfer polishing in the above exemplary embodiment, a polymer may be added to the abrasive-grain-containing polishing solution in the pre-finish mirror chamfer polishing.

Further, though the pre-finish mirror chamfer polishing is performed in order to remove the oxide film on the chamfered portion of the semiconductor wafer in the exemplary embodiment, such an arrangement is not exhaustive. For instance, a semiconductor wafer having no oxide film on the chamfered portion may be provided by forming the oxide film while the chamfered portion is masked and subsequently removing the mask. Alternatively, a semiconductor wafer having no oxide film on the chamfered portion may be provided by forming the oxide film on the entire surface of the semiconductor wafer and removing only the oxide film on the chamfered portion of the semiconductor wafer by, for instance, etching.

Though the oxide film formed on the entire surface of the semiconductor wafer is formed during the washing process, the oxide film may be formed on the entire surface of the semiconductor wafer using a chemical solution. According to the above arrangement, unlike the natural oxide film, the thickness of the oxide film can be appropriately adjusted.

The polishing pad used in the pre-finish mirror chamfer polishing may be as hard as possible. By increasing the hardness of the polishing pad in the pre-finish mirror chamfer polishing, the wafer is kept from being sunk into the polishing pad. Consequently, since the polishing pad is restrained from being applied over the top side or top and bottom sides of the wafer (i.e. not only to the chamfered portion), the over-polishing during the pre-finish mirror chamfer polishing can be restrained.

The specific procedure(s) and design(s) in implementing the invention may be modified as long as such modification(s) are compatible with an object of the invention.

EXAMPLES

Next, the invention will be described in further detail below with reference to Examples and Comparative Examples. However, it should be understood that the scope of the invention is not limited by the Examples and Comparative Examples.

Example 1

Initially, the semiconductor wafer 10 in a form of a silicon wafer of a 300 mm diameter and crystal orientation (100) and having a 0.9 nm-thick natural oxide film formed on the entire surface was prepared by sequentially performing the steps of slicing, chamfering, lapping, etching, double-sided polishing and washing.

Next, using the chamfer-polishing machine 20 shown in FIG. 2A, the chamfered portion of the washed silicon wafer is mirror-polished. The mirror-polishing is performed in two stages including the first step (pre-finish mirror chamfer polishing) and the second step (mirror-finishing chamfer polishing).

First Step (Pre-Finish Mirror Chamfer Polishing)
Polishing pad: including a polishing cloth made of an unwoven fabric (compression rate: 4.1%)
Polishing solution: abrasive-grain-containing polishing solution (KOH aqueous solution of pH 10-11 containing colloidal silica abrasive grains whose average diameter was 50 nm)
Second Step (Mirror-Finishing Chamfer Polishing)
Polishing pad: including a polishing cloth made of suede (compression rate: 6.7%)
Polishing solution: abrasive-grain-free polishing solution (KOH aqueous solution of pH 10-11)

Comparative Example 1

A silicon wafer was obtained in the same manner as in Example 1 except that the conditions for mirror-chamfer polishing were changed follows.

First Step (Pre-Finish Mirror Chamfer Polishing)
Polishing pad: including a polishing cloth made of an unwoven fabric (compression rate: 6.9%)
Polishing solution: abrasive-grain-containing polishing solution (KOH aqueous solution of pH 10-11 containing colloidal silica abrasive grains whose average diameter was 50 nm)
Second Step (Mirror-Finishing Chamfer Polishing)
Polishing pad: including a polishing cloth made of suede (compression rate: 6.7%)
Polishing solution: abrasive-grain-containing polishing solution (KOH aqueous solution of pH 10-11 containing colloidal silica abrasive grains whose average diameter was 50 nm)

Comparative Example 2

A silicon wafer was obtained in the same manner as in Example 1 except that the conditions for mirror-chamfer polishing were changed as follows. Unlike the above Example 1 and Comparative Example 1, a single-stage mirror polishing was performed in Comparative Example 2.
Polishing pad: including a polishing cloth made of an unwoven fabric (compression rate: 6.9%)
Polishing solution: abrasive-grain-containing polishing solution (KOH aqueous solution of pH 10-11 containing colloidal silica abrasive grains whose average diameter was 50 nm)

Comparative Example 3

A silicon wafer was obtained in the same manner as in Example 1 except that the conditions for mirror-chamfer polishing were changed as follows. In the same manner as the above Comparative Example 2, a single-stage mirror polishing was performed in Comparative Example 3.
Polishing pad: including a polishing cloth made of an unwoven fabric (compression rate: 4.1%)
Polishing solution: abrasive-grain-containing polishing solution (KOH aqueous solution of pH 10-11 containing colloidal silica abrasive grains whose average diameter was 50 nm)

Evaluations

A plurality of silicon wafers having been subjected to the mirror chamfer polishing obtained in Example 1 and Comparative Examples 1-3 were prepared. FZDD (Frontside_ZDD) (second order differential value of surface profile) of each of these silicon wafers was calculated using a flatness measuring machine (Wafer-Sight2 manufactured by KLA-Tencor Corporation). The FZDD is a scale of a magnitude of the edge roll-off. The results are shown in FIG. 3.

Further, the microroughness of the chamfered portion of these silicon wafers was measured using a laser interferometer (manufactured by Chapman Instruments, Inc.). The results are shown in FIG. 4.

Figure 3:
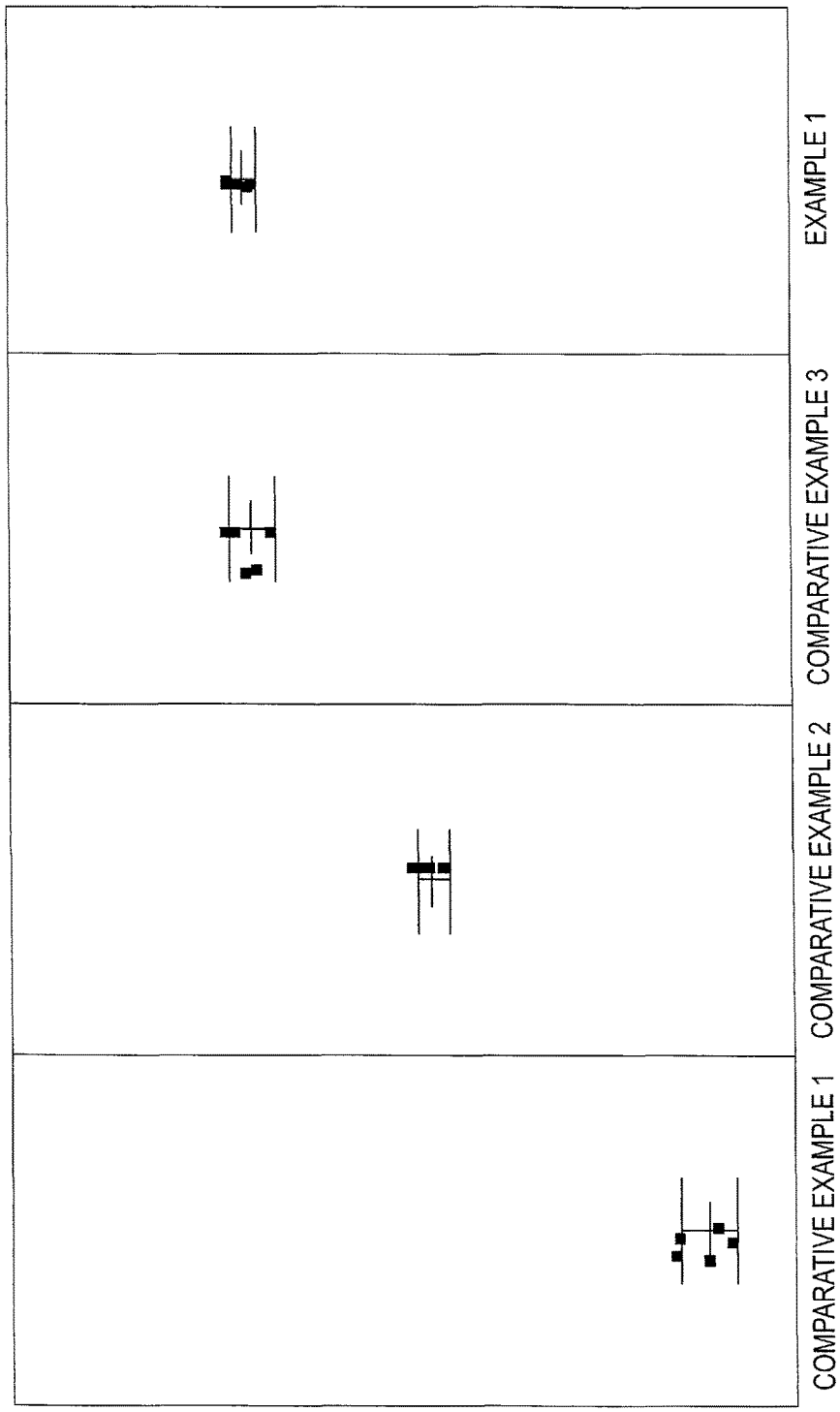
FIG. 3 shows FZDD of a 1-mm edge exception area of the semiconductor wafer in Examples and Comparative Examples.
Figure 5A:
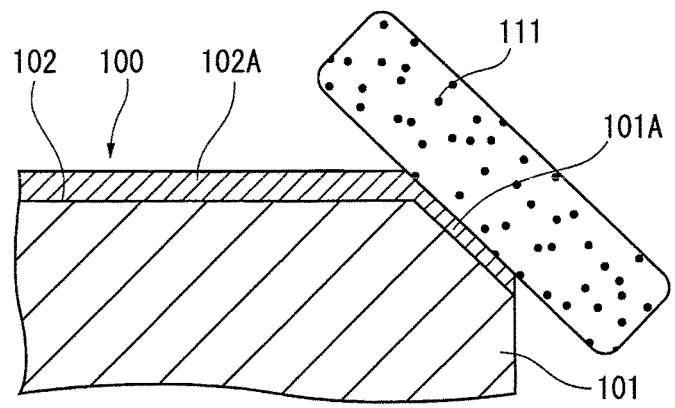
FIG. 5A is an enlarged cross section of a part of a semiconductor wafer during a typical mirror-finishing chamfer polishing, which shows how the semiconductor wafer is polished before an oxide film is removed in a first step.
Figure 5B:
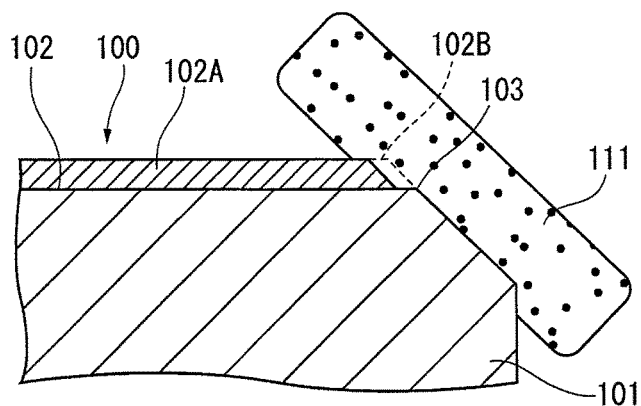
FIG. 5B is another enlarged cross section of the part of the semiconductor wafer during the typical mirror-finishing chamfer polishing, which shows how the semiconductor wafer is polished after the oxide film is removed in the first step.
Figure 5C:
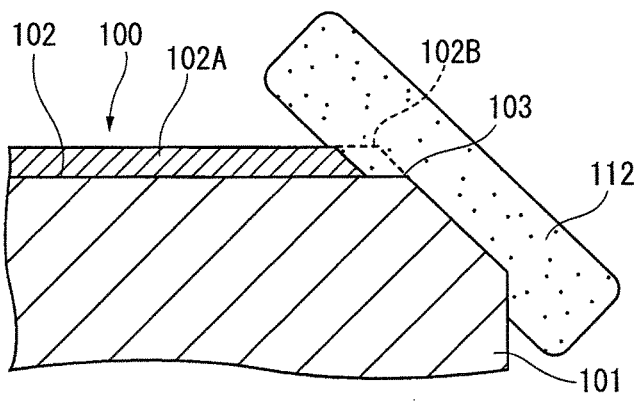
FIG. 5C is still another enlarged cross section of the part of the semiconductor wafer during the typical mirror-finishing chamfer polishing, which shows how the semiconductor is polished in a second step.

As is clear from the results of Comparative Examples 1 and 2 in FIG. 3, when the abrasive-grain-containing polishing solution is used for finish polishing, the edge roll-off is considerably deteriorated. On the other hand, as is clear from the results of Comparative Example 3 and Example 1, when the abrasive-grain-free polishing solution is used for finish polishing, the edge roll-off is not deteriorated. Further, from the results of Comparative Examples 2 and 3, it is found that the edge roll-off is more reduced by using an unwoven fabric whose compression rate is lower (i.e. with higher hardness) as the polishing cloth of the polishing pad when the abrasive-grain-containing polishing solution is used for polishing.

As is clear from the results of Comparative Examples 2 and 3 in FIG. 4, the microroughness increases in a single-stage mirror chamfer polishing with the use of the abrasive-grain-containing polishing solution and an unwoven fabric for the polishing cloth of the polishing pad. On the other hand, as is clear from the results of Comparative Example 1 and Example 1, the microroughness of the chamfered portion, which is considerably large in the polishing in the first step, can be significantly reduced in a two-stage mirror chamfer polishing with the use of suede as the polishing cloth for the polishing pad in the second step.

From the results shown in FIGS. 3 and 4, it is found that the edge roll-off can be restrained and the roughness at the chamfered portion can be flattened in Example 1 according to the invention.

The invention claimed is:

1. A manufacturing method of a semiconductor wafer comprising a top side, a bottom side, a chamfered portion and an oxide film, the oxide film being provided on the top side or on the top and bottom sides and not provided on the chamfered portion, the method comprising:
    applying a mirror-finishing chamfer polishing to upper, central and lower parts of the chamfered portion and the top side or both the top and bottom sides of the semiconductor wafer using an abrasive-grain-free polishing solution, so that the oxide film provided on the top side or both the top and bottom sides of the semiconductor wafer is not removed, and only the upper, central, and lower parts of the chamfered portion are polished.

2. The manufacturing method of a semiconductor wafer according to claim 1, further comprising:
    prior to the mirror-finishing chamfer polishing, applying a pre-finish mirror chamfer polishing to the upper, central and lower parts of the chamfered portion of the semiconductor wafer comprising the oxide film on the top side or on the top and bottom sides and on the chamfered portion using an abrasive-grain-containing polishing solution, so that the oxide film provided on the upper, central and lower parts of the chamfered portion is removed.

3. The manufacturing method of a semiconductor wafer according to claim 2, wherein
    an unwoven fabric of less than 7% of a compression rate is used for a polishing pad used in the pre-finish mirror chamfer polishing, and suede of 6% or more of the compression rate is used for the polishing pad used in the mirror-finishing chamfer polishing.

4. The manufacturing method of a semiconductor wafer according to claim 1, wherein
    the abrasive-grain-free polishing solution used in the mirror-finishing chamfer polishing comprises a polymer.

* * * * *